(12) United States Patent
Kean et al.

(10) Patent No.: US 11,843,355 B2
(45) Date of Patent: Dec. 12, 2023

(54) HIGH-ENERGY SUPPRESSION FOR CAPACITOR TRANSIMPEDANCE AMPLIFIER (CTIA)-BASED IMAGERS OR OTHER IMAGING DEVICES

(71) Applicant: Raytheon Company, Waltham, MA (US)

(72) Inventors: Bryan W. Kean, Denver, CO (US); Eric J. Beuville, Goleta, CA (US); Ravi S. Kirschner, San Francisco, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/649,994

(22) Filed: Feb. 4, 2022

(65) Prior Publication Data
US 2023/0253932 A1 Aug. 10, 2023

(51) Int. Cl.
*H03F 3/08* (2006.01)
*H03F 1/08* (2006.01)
*H03F 3/70* (2006.01)

(52) U.S. Cl.
CPC ............... *H03F 3/087* (2013.01); *H03F 1/08* (2013.01); *H03F 3/70* (2013.01)

(58) Field of Classification Search
CPC .. H03F 3/087; H03F 1/08; H03F 3/70; H03K 5/22
USPC ........................................................ 330/308
See application file for complete search history.

(56) References Cited

U.S. PATENT DOCUMENTS

| 6,252,462 | B1 | 6/2001 | Hoffman |
| 6,885,002 | B1 | 4/2005 | Finch et al. |
| 6,927,796 | B2 | 8/2005 | Liu et al. |
| 7,148,727 | B2 * | 12/2006 | Van Bogget ........ H03F 3/45977 327/87 |
| 9,628,105 | B1 | 4/2017 | Veeder |
| 10,242,268 | B2 | 3/2019 | Harris et al. |
| 2003/0150979 | A1 | 8/2003 | Lauffenburger et al. |
| 2005/0199813 | A1 | 9/2005 | Van Bogget |
| 2008/0106297 | A1 | 5/2008 | Jao |

(Continued)

FOREIGN PATENT DOCUMENTS

TW I287818 B 10/2007

OTHER PUBLICATIONS

Cantrell, "Digital Pixel Comparator with Bloom Transistor Frontend," U.S. Appl. No. 17/216,481, filed Mar. 29, 2021, 48 pages.

(Continued)

*Primary Examiner* — Hieu P Nguyen

(57) ABSTRACT

An apparatus includes a photodetector configured to generate an electrical current based on received illumination. The apparatus also includes a capacitor transimpedance amplifier (CTIA) unit cell having (i) an amplifier configured to receive the electrical current and a reference voltage, (ii) a feedback capacitor coupled in parallel across the amplifier, and (iii) a reset switch coupled in parallel across the feedback capacitor. The apparatus further includes an event detector configured to sense a high-energy event affecting the photodetector. In addition, the apparatus includes a switchable clamp coupled across inputs of the amplifier, where the event detector is configured to close the switchable clamp in response to sensing the high-energy event.

20 Claims, 3 Drawing Sheets

(56) References Cited

U.S. PATENT DOCUMENTS

| | | |
|---|---|---|
| 2011/0221520 A1 | 9/2011 | Bales |
| 2012/0261553 A1 | 10/2012 | Elkind et al. |
| 2012/0305786 A1 | 12/2012 | Dierickx |
| 2017/0205283 A1 | 7/2017 | Wyles et al. |
| 2018/0124336 A1 | 5/2018 | Jonas |
| 2019/0313046 A1 | 10/2019 | McGee, III et al. |
| 2019/0335118 A1 | 10/2019 | Simolon et al. |

OTHER PUBLICATIONS

Boemler, "High-Energy Suppression for Infrared Imagers or Other Imaging Device," U.S. Appl. No. 17/480,554, filed Sep. 21, 2021, 32 pages.

Abbasi et al., "A PFM-Based Digital Pixel With an Off-Pixel Residue Measurement for Small Pitch FPAs," IEEE Transactions on Circuits and Systems—II: Express Briefs, vol. 64, No. 8, Aug. 2017, 5 pages.

Bisiaux et al., "A 14-b Two-step Inverter-based $\Sigma\Delta$ ADC for CMOS Image Sensor," 15th IEEE International New Circuits and Systems Conference, Nov. 2017, 4 pages.

Non-Final Office Action dated Apr. 19, 2023 in connection with U.S. Appl. No. 17/480,554, 11 pages.

Kean, "Artifact Mitigation in Capacitor Transimpedance Amplifier (CTIA)-Based Imagers Or Other Imaging Devices," U.S. Appl. No. 18/165,663, filed Feb. 7, 2023, 36 pages.

Kean, "High Flux Detection and Imaging Using Capacitor Transimpedance Amplifier (CTIA)-Based Unit Cells in Imaging Devices," U.S. Appl. No. 18/165,713, filed Feb. 7, 2023, 49 pages.

Notice of Allowance dated Oct. 3, 2023 in connection with U.S. Appl. No. 17/480,554, 13 pages.

\* cited by examiner

HIGH-ENERGY SUPPRESSION FOR CAPACITOR TRANSIMPEDANCE AMPLIFIER (CTIA)-BASED IMAGERS OR OTHER IMAGING DEVICES

TECHNICAL FIELD

This disclosure relates generally to imaging systems. More specifically, this disclosure relates to high-energy suppression for capacitor transimpedance amplifier (CTIA)-based imagers or other imaging devices.

BACKGROUND

Digital imaging systems often use integrators to capture information when generating digital images. For example, an electrical current from a pixel can be integrated during a sampling period, and an integrated voltage generated as a result of the integration can be sampled and used to generate image data for that pixel. This process can be performed for each pixel in an imaging array in order to generate image data for the array.

SUMMARY

This disclosure relates to high-energy suppression for capacitor transimpedance amplifier (CTIA)-based imagers or other imaging devices.

In a first embodiment, an apparatus includes a photodetector configured to generate an electrical current based on received illumination. The apparatus also includes a CTIA unit cell having (i) an amplifier configured to receive the electrical current and a reference voltage, (ii) a feedback capacitor coupled in parallel across the amplifier, and (iii) a reset switch coupled in parallel across the feedback capacitor. The apparatus further includes an event detector configured to sense a high-energy event affecting the photodetector. In addition, the apparatus includes a switchable clamp coupled across inputs of the amplifier, where the event detector is configured to close the switchable clamp in response to sensing the high-energy event.

In a second embodiment, a system includes a focal plane array having multiple optical detectors. Each optical detector includes a photodetector configured to generate an electrical current based on received illumination. Each optical detector also includes a CTIA unit cell having (i) an amplifier configured to receive the electrical current and a reference voltage, (ii) a feedback capacitor coupled in parallel across the amplifier, and (iii) a reset switch coupled in parallel across the feedback capacitor. Each optical detector further includes an event detector configured to sense a high-energy event affecting the photodetector. In addition, each optical detector includes a switchable clamp coupled across inputs of the amplifier, where the event detector is configured to close the switchable clamp in response to sensing the high-energy event.

In a third embodiment, a method includes generating an electrical current based on received illumination using a photodetector. The method also includes integrating the electrical current using a CTIA unit cell having (i) an amplifier that receives the electrical current and a reference voltage, (ii) a feedback capacitor coupled in parallel across the amplifier, and (iii) a reset switch coupled in parallel across the feedback capacitor. The method further includes sensing a high-energy event affecting the photodetector. In addition, the method includes, in response to sensing the high-energy event, closing a switchable clamp coupled across inputs of the amplifier.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
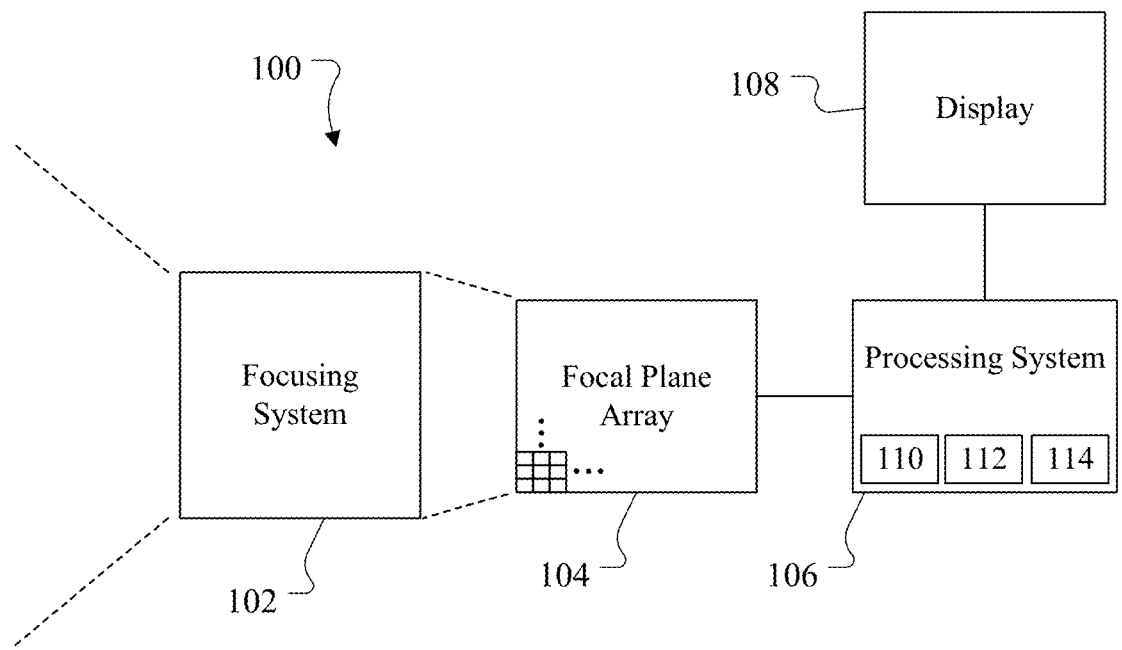
FIG. 1 illustrates an example system supporting high-energy suppression for at least one capacitor transimpedance amplifier (CTIA)-based imager or other imaging device according to this disclosure.

FIGS. 1 through 5, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, digital imaging systems often use integrators to capture information when generating digital images. For example, an electrical current from a pixel can be integrated during a sampling period, and an integrated voltage generated as a result of the integration can be sampled and used to generate image data for that pixel. This process can be performed for each pixel in an imaging array in order to generate image data for the array.

Some digital imaging systems are intended for use in harsh environments where large transient energy spikes may impact the imaging systems. For example, satellites used in space may be subjected to transient energy spikes caused by natural or manmade phenomena, such as when an adversary directs laser energy at a satellite. As another example, some robotic systems or other systems may be designed for use in radioactive environments or other environments where large amounts of nuclear radiation may strike the systems. As still other examples, some robotic systems or other systems may be designed for use in surgical or industrial settings where laser energy used for surgical or industrial purposes may strike the systems. As yet another example, medical imaging systems may be designed to facilitate imaging of patients in the presence of large spikes in x-rays or other electromagnetic energy. These types of energy may be broadly referred to environmental noise, which can refer to any energy that interferes with digital imaging systems (including laser energy, gamma radiation, x-rays, ultraviolet energy, or other electromagnetic energy). Unfortunately, digital imaging systems are often highly susceptible to transient energy spikes, which may cause blooming or elevated dark current effects in pixels of the imaging systems or which may overwhelm the limited charging capacities of capacitors in the imaging systems.

Some approaches for combatting the effects of energy spikes in digital imaging systems involve using reduced imaging times in order to isolate environmental noise to specific data samples, which can be filtered after imaging data has been collected. However, this approach may interfere with operation of imaging systems that require longer imaging or integration times. Other approaches for combatting the effects of energy spikes in digital imaging systems involve filtering image data from certain pixels based on image data generated by neighboring pixels. However, these approaches can reduce the image quality of resulting images and are unsuitable for use when large numbers of pixels are impacted by an energy spike. Still other approaches for combatting the effects of energy spikes in digital imaging systems involve using different types of integrating unit cells that are less sensitive. However, these approaches may reduce the overall sensitivity of an imaging system and can interfere with operation of imaging systems that require higher sensitivities.

This disclosure provides circuits that support high-energy suppression for capacitor transimpedance amplifier (CTIA)-based imagers or other imaging devices. As described in more detail below, various circuit elements are provided and used in CTIA-based imaging architectures. For example, each of multiple optical detectors in an imaging device may include a CTIA unit cell that integrates an electrical current produced by a corresponding photodiode or other pixel of the imaging device. Each CTIA unit cell may include an amplifier that helps to generate an integration voltage across a feedback capacitor, and the voltage on the feedback capacitor can be reset prior to each sampling period and can be sampled during each sampling period.

Each optical detector also includes an event detector and a switchable clamp coupled across the inputs of the amplifier in that optical detector. When an event detector detects a high-energy event, the associated switchable clamp can be closed to short-circuit the inputs of the amplifier for that optical detector. This effectively ties both inputs of the amplifier to a reference voltage source. Thus, a fast pulse produced by a pixel during a high-energy event is not significantly integrated by the amplifier (since the CTIA unit cell can have a relatively limited bandwidth) and is instead diverted to the reference voltage source. This can help to reduce or prevent an excessive amount of electrical energy from being integrated by the CTIA unit cell. After a pulse has stopped, the switchable clamp can be opened so that the CTIA unit cell is able to resume normal operation.

In this way, the event detectors and the switchable clamps can be used to maintain suitable reverse bias voltages for pixels by quickly draining away excess electrical charges generated by the pixels, which also helps to divert large electrical charges away from the amplifiers in the optical detectors. As a result, these circuit elements can be used to support imaging system data readout that is tolerant to high-energy effects and that allows for excellent imaging during high-energy conditions. For instance, it is possible for some pixels to operate correctly even while other pixels might be experiencing a high-energy event, and any pixels that experience a high-energy event may recover quickly and resume normal operation. Moreover, these circuit elements allow high-energy suppression to be achieved using small, low-power circuits.

Imaging systems designed in accordance with this disclosure may be used in any suitable applications. For example, imaging systems designed in accordance with this disclosure may be used in commercial and defense-related satellites, such as to produce visible, infrared, or other images of scenes. As another example, imaging systems designed in accordance with this disclosure may be used in robotic systems or other systems intended for use in surgical or industrial settings, such as to generate images of patients undergoing treatment or images of components being fabricated or processed using lasers or other electromagnetic energy. As still another example, imaging systems designed in accordance with this disclosure may be used in medical imaging systems, such as to produce images of patients in the presence of x-rays or other electromagnetic energy. In general, the imaging systems designed in accordance with this disclosure may be used in any suitable applications where high-energy events may otherwise interfere with proper operation of the imaging systems.

FIG. 1 illustrates an example system 100 supporting high-energy suppression for at least one CTIA-based imager or other imaging device according to this disclosure. As shown in FIG. 1, the system 100 includes a focusing system 102, a focal plane array 104, and a processing system 106. The focusing system 102 generally operates to focus illumination from a scene onto the focal plane array 104. The focusing system 102 may have any suitable field of view that is directed onto the focal plane array 104. The focusing system 102 includes any suitable structure(s) configured to focus illumination, such as one or more lenses, mirrors, or other optical devices.

The focal plane array 104 generally operates to capture image data related to a scene. For example, the focal plane array 104 may include a matrix or other collection of optical detectors that generate electrical signals representing a scene, as well as other components that process the electrical signals. Several of the optical detectors are shown in FIG. 1, although the size of the optical detectors is exaggerated for convenience here. The focal plane array 104 may capture image data in any suitable spectrum or spectra, such as in the visible, infrared, or ultraviolet spectrum. The focal plane array 104 may also have any suitable resolution, such as when the focal plane array 104 includes a collection of approximately 1,000 optical detectors by approximately 1,000 optical detectors (although other collection sizes may be used). The focal plane array 104 includes any suitable collection of optical detectors configured to capture image data. The focal plane array 104 may also include additional components that facilitate the receipt and output of information, such as readout integrated circuits (ROICs).

As described in more detail below, the optical detectors of the focal plane array 104 include pixels (such as photodiodes) that capture illumination from a scene and generate electrical currents. For each pixel, the electrical current of the pixel can be integrated using a CTIA unit cell, and an integrated voltage can be produced and sampled to generate image data for that pixel. Each CTIA unit cell may include an amplifier, as well as a feedback capacitor and a reset switch coupled across the amplifier. The feedback capacitor can be used to generate the integrated voltage, and the reset switch can be used to reset the voltage stored on the feedback capacitor. Each optical detector of the focal plane array 104 may also include an event detector and a switchable clamp coupled across the inputs of the associated amplifier. The switchable clamp can be closed to short-circuit the inputs of the amplifier and help prevent an excessive amount of electrical energy from being integrated by the amplifier, thereby helping to mitigate the effects of high-energy events.

The processing system 106 receives outputs from the focal plane array 104 and processes the information. For example, the processing system 106 may process image data generated by the focal plane array 104 in order to generate visual images for presentation to one or more personnel, such as on a display 108. However, the processing system 106 may use the image data generated by the focal plane array 104 in any other suitable manner. The processing system 106 includes any suitable structure configured to process information from a focal plane array or other imaging system. For instance, the processing system 106 may include one or more processing devices 110, such as one or more microprocessors, microcontrollers, digital signal processors, field programmable gate arrays, application specific integrated circuits, or discrete logic devices. The processing system 106 may also include one or more memories 112, such as a random access memory, read only memory, hard drive, Flash memory, optical disc, or other suitable volatile or non-volatile storage device(s). The processing system 106 may further include one or more interfaces 114 that support communications with other systems or devices, such as a network interface card or a wireless transceiver facilitating communications over a wired or wireless network or a direct connection. The display 108 includes any suitable device configured to graphically present information.

Although FIG. 1 illustrates one example of a system 100 supporting high-energy suppression for at least one CTIA-based imager or other imaging device, various changes may be made to FIG. 1. For example, various components in FIG. 1 may be combined, further subdivided, replicated, omitted, or rearranged and additional components may be added according to particular needs. Also, FIG. 1 illustrates one example type of system in which high-energy suppression for an imaging device may be used. However, this functionality may be used in any other suitable device or system.

Figure 2:
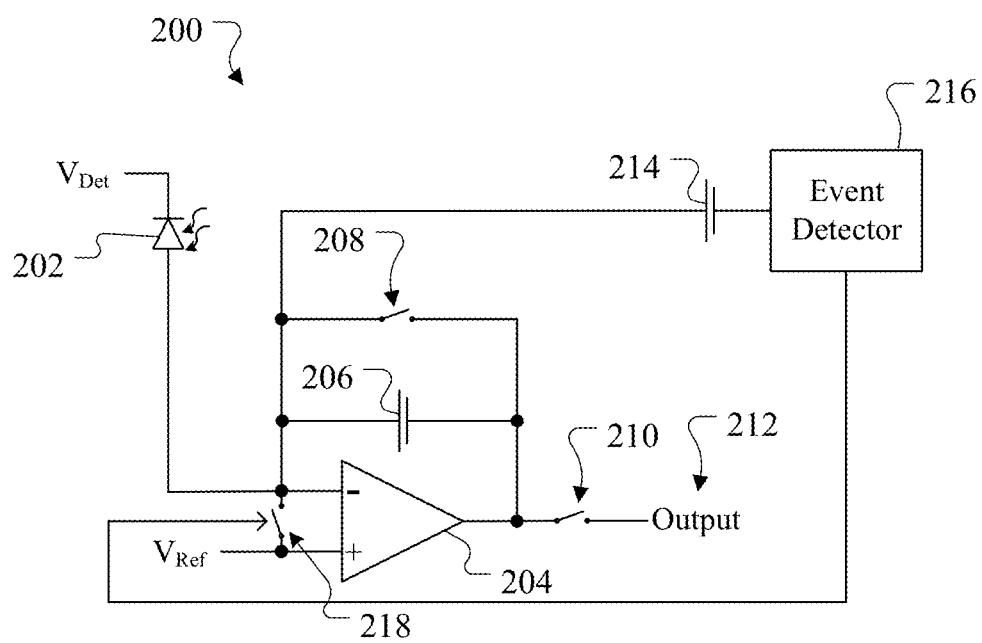
FIG. 2 illustrates an example circuit supporting high-energy suppression for a CTIA-based imager or other imaging device according to this disclosure.

FIG. 2 illustrates an example circuit 200 supporting high-energy suppression for a CTIA-based imager or other imaging device according to this disclosure. An instance of the circuit 200 shown in FIG. 2 may, for example, represent (or be used as at least part of) each optical detector of the focal plane array 104 in the system 100 shown in FIG. 1. Thus, different optical detectors of the focal plane array 104 may include different instances of the circuit 200 shown in FIG. 2. However, any number of the circuits 200 may be used with any other suitable device and in any other suitable system.

As shown in FIG. 2, the circuit 200 includes a pixel in the form of a photodetector 202, which generally operates to produce an electrical current based on received illumination. The photodetector 202 includes any suitable structure configured to generate an electrical current based on received illumination, such as a photodiode. In some cases, the photodetector 202 may represent a photodiode or other structure that can sense illumination in a specified wavelength range or band, such as in the visible, infrared, or ultraviolet spectrum. The photodetector 202 here is coupled to receive a detector voltage $V_{Det}$, which may be provided by any suitable voltage source.

The electrical current generated by the photodetector 202 is provided to an amplifier 204, and a feedback capacitor 206 and a reset switch 208 are coupled in parallel across the amplifier 204 (meaning the feedback capacitor 206 and the reset switch 208 are each coupled to the input and the output of the amplifier 204). The amplifier 204 in this example is arranged as an inverting amplifier that receives the electrical current generated by the photodetector 202 on an inverting input terminal and a reference voltage $V_{REF}$ on a non-inverting input terminal. An output generated by the amplifier 204 can be proportional to a product of the electrical current generated by the photodetector 202 and the integration or sampling time and can be inversely proportional to the voltage stored on the feedback capacitor 206. The output from the amplifier 204 here is used to charge the feedback capacitor 206. The reset switch 208 can be closed prior to a sampling period in order to reset the voltage stored on the feedback capacitor 206, and the reset switch 208 can be opened at the beginning of a sampling period in order to allow the feedback capacitor 206 to be charged and thereby store an integrated voltage based on the electrical current produced by the photodetector 202 during the sampling period. An output switch 210 may be opened during the integration and may be selectively closed, such as at the end of a sampling period, in order to allow the integrated voltage to be sampled or otherwise provided as an output signal 212. Note that a read-out circuit or other component for providing or using the output signal 212 is omitted here for simplicity. Effectively, these components form a CTIA unit cell that converts the electrical current generated by the photodetector 202 into a corresponding voltage during each of one or more sampling periods.

The amplifier 204 includes any suitable structure configured to generate an amplified output based on an input electrical current. The capacitor 206 includes any suitable capacitive structure having any suitable capacitance. Each switch 208, 210 includes any suitable structure configured to selectively form and break an electrical connection, such as a transistor.

The CTIA unit cell shown in FIG. 2 can be used to generate very accurate image data for a scene. In some cases, for instance, the amplifier 204 may use a bias current of only a few nano-amps so that the CTIA unit cell can detect very low electrical currents from the photodetector 202. However, the CTIA unit cell tends to be very sensitive to perturbations in its inputs. Without anything else, a large current spike produced by the photodetector 202 and provided to the inverting input terminal of the amplifier 204 may overwhelm the CTIA unit cell and cause the photodetector 202 to be subjected to a wrong reverse bias voltage. If that occurs, the photodetector 202 would not be usable in terms of accumulating an intended photo-charge. Worse, in some cases, the photodetector 202 itself may start to emit photons, such as due to electron emission (blooming) and/or light emitting diode (LED) operation.

The circuit 200 here includes a capacitor 214 coupled to an energy event detector 216, and a switchable clamp 218 is coupled across the inputs of the amplifier 204. The capacitor 214 can be charged based on the electrical current from the photodetector 202, and the capacitor 214 essentially provides an alternating current (AC) coupling of the energy event detector 216 to the CTIA unit cell. The capacitor 214 includes any suitable capacitive structure having any suitable capacitance. Note, however, that the energy event detector 216 may be coupled to the CTIA unit cell in any other suitable manner.

The energy event detector 216 is configured to detect high-energy events, such as by comparing a voltage stored on the capacitor 214 to a specified reference voltage (which can be set to identify a threshold energy level at which a high-energy event is detected). This may allow, for example, the energy event detector 216 to detect relatively-large or other spikes or pulses contained in the electrical current generated by the photodetector 202. The energy event detector 216 includes any suitable structure configured to detect an input indicative of a high-energy event, such as a highspeed differentiator and comparator with a diode reset. The energy event detector 216 may also include a buffer that facilitates driving of the switchable clamp 218. The switchable clamp 218 can be used to selectively form and break an electrical connection across the inputs of the amplifier 204. The switchable clamp 218 includes any suitable structure configured to selectively form and break an electrical connection, such as at least one transistor or other switch.

In response to the energy event detector 216 detecting a pulse or other increase in the electrical output of the photodetector 202, the energy event detector 216 can quickly create a short clamping pulse that causes the switchable clamp 218 to close. Closing the switchable clamp 218 during a high-energy event short-circuits the inputs of the amplifier 204 and prevents the bulk of the electrical current generated by the photodetector 202 from being integrated by the amplifier 204. Instead, the output of the photodetector 202 can be tied to the source of the reference voltage $V_{REF}$, which helps maintain proper biasing of the photodetector 202 and allows excess electrical energy generated by the photodetector 202 to bleed off away from the amplifier 204. When the energy event detector 216 stops detecting the pulse or other increase in the electrical output of the photodetector 202, the energy event detector 216 can open the switchable clamp 218, which allows the CTIA unit cell to resume normal operation.

In this way, the circuit 200 is able to provide high-energy suppression in an optical detector of an imaging system. Multiple instances of the circuit 200 can be used to provide high-energy suppression in multiple optical detectors of the imaging system. Overall, this can help to enable rapid recovery of the imaging system from high-energy events and enable improved operation of the imaging system during the high-energy events.

Although FIG. 2 illustrates one example of a circuit 200 supporting high-energy suppression for a CTIA-based imager or other imaging device, various changes may be made to FIG. 2. For example, any additional components may be used with the circuit 200 to support other desired functions. Specific examples of additional circuit components that may be used with the circuit 200 are provided below.

Figure 3:
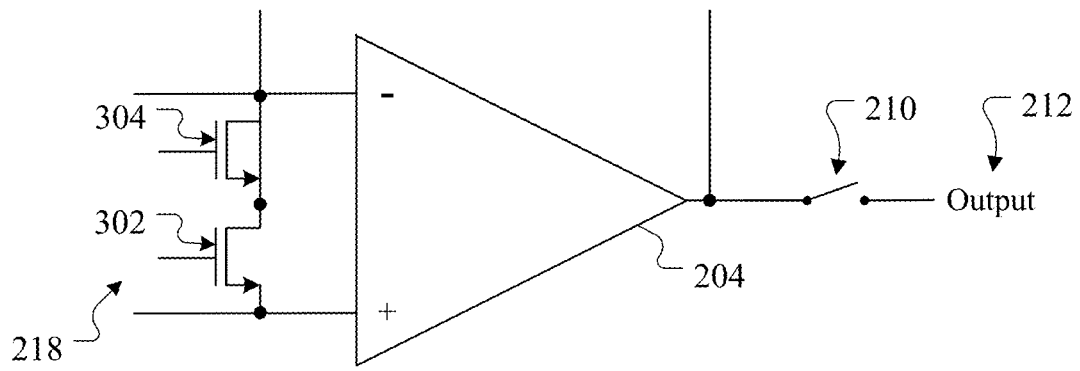
FIG. 3 illustrates an example transistor-based clamp supporting high-energy suppression for a CTIA-based imager or other imaging device according to this disclosure.

FIG. 3 illustrates an example transistor-based clamp 300 supporting high-energy suppression for a CTIA-based imager or other imaging device according to this disclosure. The transistor-based clamp 300 may, for example, represent one specific implementation of the switchable clamp 218 in the circuit 200 of FIG. 2. Note, however, that the switchable clamp 218 may be implemented in any other suitable manner.

As shown in FIG. 3, the switchable clamp 218 in this example embodiment is implemented using two transistors 302 and 304 that are coupled in series between the inputs of the amplifier 204. The transistors 302 and 304 here are implemented using metal oxide semiconductor field effect transistors (MOSFETs), although other suitable types of transistors or other switching devices may be used.

The transistor 302 in this example represents a switchable device that can be selectively operated to form and break an electrical connection between the inputs of the amplifier 204. As noted above, when the transistor 302 is closed, both inputs of the amplifier 204 can be coupled to a reference voltage source and receive the reference voltage $V_{REF}$. When the transistor 302 is opened, the amplifier 204 receives the electrical current generated by the photodetector 202 and the reference voltage $V_{REF}$, and the amplifier 204 helps the CTIA unit cell to integrate the electrical current generated by the photodetector 202 during a sampling period. A gate of the transistor 302 can be driven by a control signal, such as the output of the energy event detector 216.

The transistor 304 in this example represents a dummy MOSFET or other dummy transistor device that can be fabricated but that cannot be selectively opened or closed. Rather, the transistor 304 may remain permanently in the closed or conductive state, and the transistor 304 may be driven by an inverse of the control signal used to control the transistor 302. The transistor 304 may be used here to counter any charge injection that might occur from turning the transistor 302 on and off.

Although FIG. 3 illustrates one example of a transistor-based clamp 300 supporting high-energy suppression for a CTIA-based imager or other imaging device, various changes may be made to FIG. 3. For example, the switchable clamp 218 may be implemented using any other suitable type(s) of transistor switches, or the switchable clamp 218 may be implemented in any other suitable manner.

Figure 4:
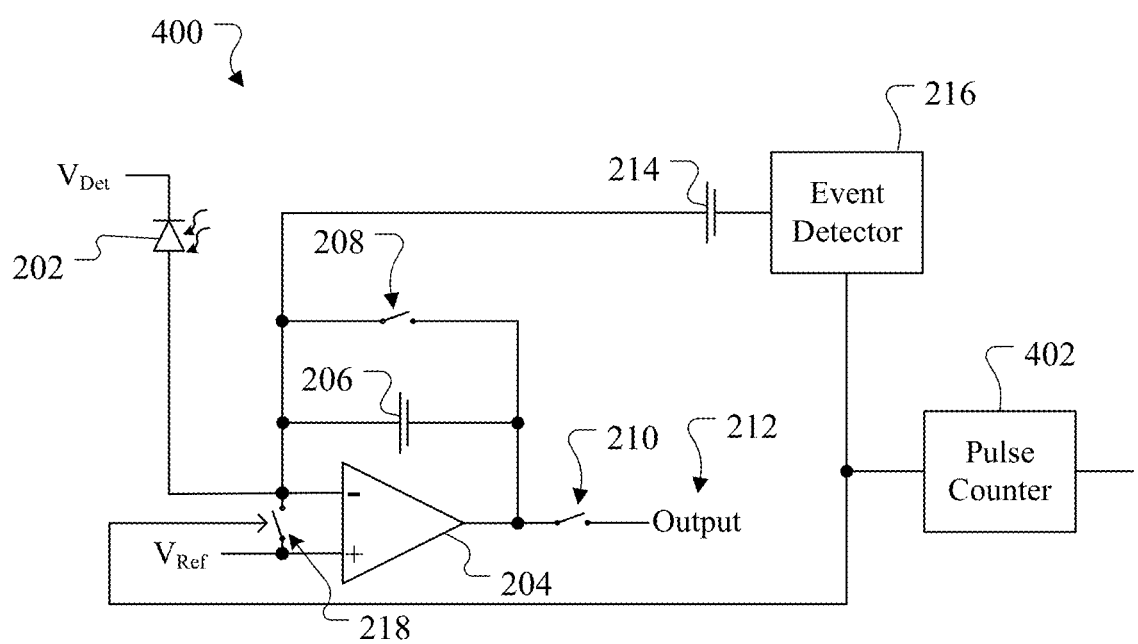
FIG. 4 illustrates an additional example circuit supporting high-energy suppression for a CTIA-based imager or other imaging device according to this disclosure.

FIG. 4 illustrates an additional example circuit 400 supporting high-energy suppression for a CTIA-based imager or other imaging device according to this disclosure. More specifically, FIG. 4 illustrates how an additional component may be used along with the components of the circuit 200 to support additional functionality related to high-energy suppression.

As shown in FIG. 4, the circuit 400 includes the same circuit components as the circuit 200 shown in FIG. 2 and described above. The circuit 400 also includes a pulse counter 402, which can be coupled to receive the output of the energy event detector 216. The pulse counter 402 is configured to count the number of times that the energy event detector 216 closes and/or opens the switchable clamp 218 during a given time period. For example, the pulse counter 402 may count the number of times that the energy event detector 216 closes and/or opens the switchable clamp 218 during each sampling period when imaging is being performed. The pulse counter 402 can also be reset, such as prior to or at the start of each sampling period or other time period.

The pulse counter 402 here allows the circuit 400 to identify how many high-energy events have been detected during each of one or more time periods. The pulse counter 402 may output its count value to any suitable destination(s), such as the processing system 106, and the count value may be used for any suitable purpose or purposes. For example, in some embodiments, the count value may be used to provide an indicator of how many high-energy events have been detected to a user. As another example, in some embodiments, the count value may be used to characterize the radiation or other electromagnetic energy striking the photodetector 202 and causing the high-energy event(s). This may allow, for instance, characterization of a radiation environment or characterization of a pulsed laser source that may be directing energy at the photodetector 202. As yet another example, in some embodiments, the count value may be used to correct image data generated by the circuit 200, such as by subtracting at least part of any residue that might remain in the generated image data due to the event detection functionality. In general, the count value may be used in any suitable manner.

Although FIG. 4 illustrates one additional example of a circuit 400 supporting high-energy suppression for a CTIA-based imager or other imaging device, various changes may be made to FIG. 4. For example, various components in FIG. 4 may be combined, further subdivided, replicated, omitted, or rearranged and additional components may be added according to particular needs. Also, FIG. 4 illustrates one example type of system in which high-energy suppression for an imaging device may be used. However, this functionality may be used in any other suitable device or system.

Figure 5:
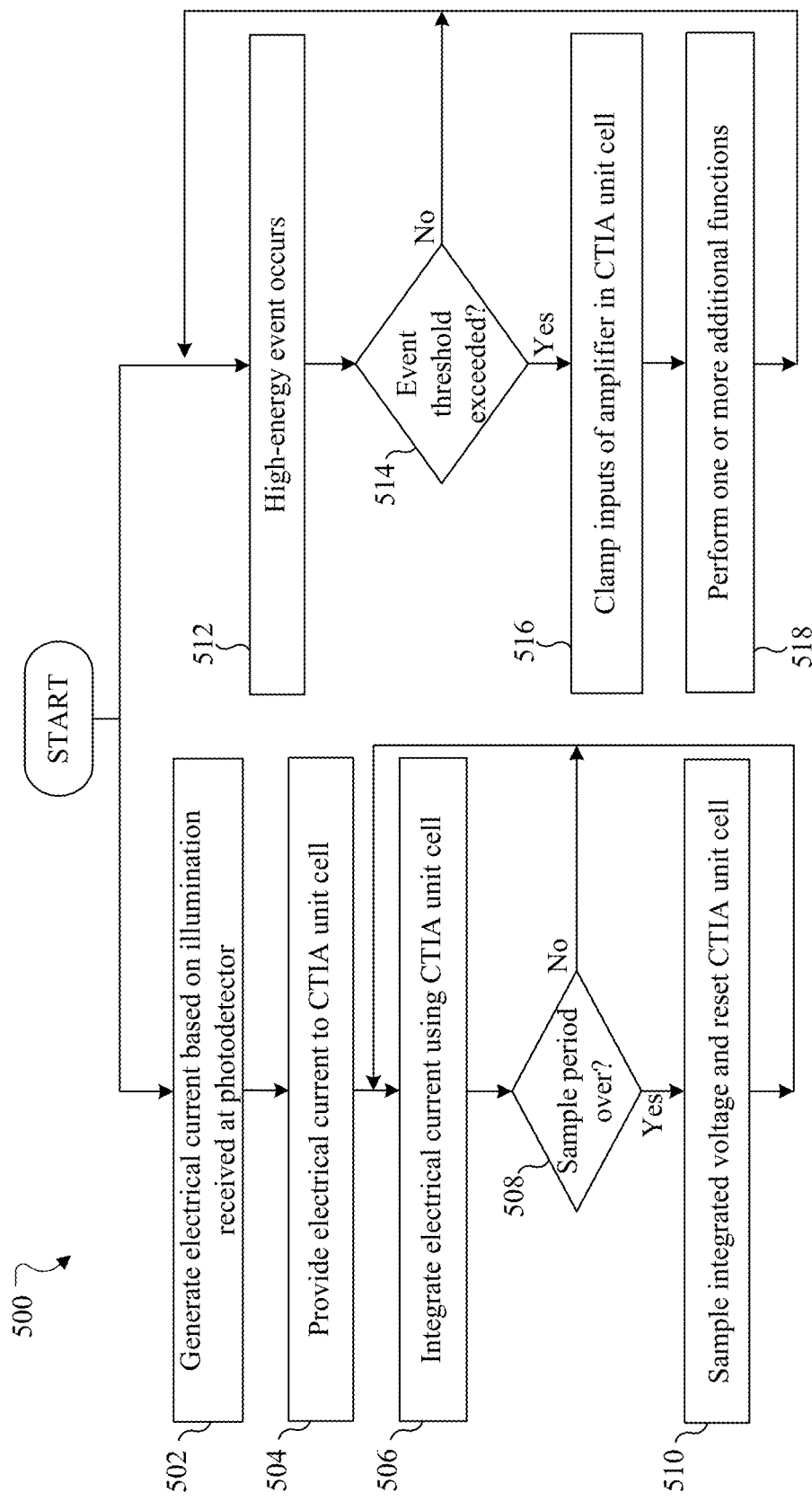
FIG. 5 illustrates an example method for high-energy suppression for at least one CTIA-based imager or other imaging device according to this disclosure.

FIG. 5 illustrates an example method 500 for high-energy suppression for at least one CTIA-based imager or other imaging device according to this disclosure. For ease of explanation, the method 500 is described as being performed using the circuit 200 of FIG. 2 in the system 100 of FIG. 1. However, the method 500 may be performed using any other suitable circuit and in any other suitable system.

As shown in FIG. 5, an electrical current is generated based on illumination received at a photodetector at step 502. This may include, for example, the photodetector 202 generating an electrical current based on received illumination. The electrical current is provided to a CTIA unit cell at step 504, and the electrical current is integrated using the CTIA unit cell at step 506. This may include, for example, the amplifier 204 generating an output signal based on the electrical current generated by the photodetector 202. This may also include an integrated voltage forming across the feedback capacitor 206 of the CTIA unit cell. Note that, prior to the integration, the reset switch 208 can be closed to reset the voltage on the feedback capacitor 206 and then opened to allow for charging of the feedback capacitor 206. Also note that the output switch 210 can be opened during the integration. A determination is made whether a sampling period has completed at step 508. If not, the process returns to step 506 so that integration of the electrical current generated by the photodetector 202 can continue. Otherwise, the integrated voltage is sampled and the CTIA unit cell is reset at step 510. This may include, for example, the output switch 210 closing so that the integrated voltage on the feedback capacitor 206 can be sampled. This may also include closing the reset switch 208 after the sampling so that the feedback capacitor 206 can be discharged and then opening the reset switch 208. The process may then optionally return to step 506 to integrate the electrical current generated by the photodetector 202 during a subsequent sampling period.

During these operations of the circuit, a high-energy event may occur at step 512. This may include, for example, a high-energy laser beam, nuclear radiation, or other energy striking the circuit 200. A determination is made whether an event threshold is exceeded at step 514. This may include, for example, the energy event detector 216 determining whether a pulse or other energy level of the photodetector's output meets or exceeds a specified threshold. If not, the energy event detector 216 may take no action. Otherwise, the inputs to the amplifier of the CTIA unit cell are clamped to block the electrical current generated by the photodetector from being integrated at step 516. This may include, for example, closing the switchable clamp 218 to couple both inputs of the amplifier 204 and the output of the photodetector 202 to the source of the reference voltage $V_{REF}$. This may help to reduce or prevent the excessive electrical current generated by the photodetector 202 (or the bulk thereof) from being integrated by the amplifier 204. One or more additional functions may optionally be performed at step 518. This may include, for example, using the pulse counter 402 to count the number of detected high-energy events (such as during each sampling period or other time period), where the count value can be used in any suitable manner (including those described above). Note that one or multiple high-energy events may occur during operation of the circuit 200.

Although FIG. 5 illustrates one example of a method 500 for high-energy suppression for at least one CTIA-based imager or other imaging device, various changes may be made to FIG. 5. For example, while various steps are shown in FIG. 5 as being performed in series and in parallel, various steps in FIG. 5 may occur in any other suitable serial and/or parallel combination. Also, various steps in FIG. 5 may occur in a different order.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a photodetector configured to generate an electrical current based on received illumination;
a capacitor transimpedance amplifier (CTIA) unit cell comprising (i) an amplifier configured to receive the electrical current and a reference voltage, (ii) a feedback capacitor coupled in parallel across the amplifier, and (iii) a reset switch coupled in parallel across the feedback capacitor;
an event detector configured to sense a high-energy event affecting the photodetector; and
a switchable clamp coupled across inputs of the amplifier, the event detector configured to close the switchable clamp in response to sensing the high-energy event.

2. The apparatus of claim 1, wherein:
the amplifier is configured to receive the electrical current on an inverting input terminal and the reference voltage on a non-inverting input terminal, the inverting input terminal coupled to an output of the photodetector; and
the switchable clamp is configured to couple the inverting input terminal to the non-inverting input terminal in order to cause the inverting input terminal to receive the reference voltage.

3. The apparatus of claim 1, further comprising:
a second capacitor configured to couple the event detector to an output of the photodetector.

4. The apparatus of claim 1, wherein:
the switchable clamp comprises first and second transistors coupled in series;
the first transistor is configured to selectively form and break an electrical connection; and
the second transistor is a dummy transistor.

5. The apparatus of claim 1, further comprising:
a pulse counter coupled to an output of the event detector and configured to count a number of high-energy events sensed by the event detector.

6. The apparatus of claim 1, wherein the event detector is configured to close the switchable clamp in order to prevent at least some of the electrical current generated by the photodetector during the high-energy event from being integrated by the CTIA unit cell.

7. The apparatus of claim 1, further comprising:
a switch coupled to an output of the amplifier, the switch configured to be opened during integration of the electrical current and to be closed to allow sampling of an integrated voltage.

8. A system comprising:
a focal plane array comprising multiple optical detectors;
wherein each optical detector comprises:
a photodetector configured to generate an electrical current based on received illumination;
a capacitor transimpedance amplifier (CTIA) unit cell comprising (i) an amplifier configured to receive the electrical current and a reference voltage, (ii) a feedback capacitor coupled in parallel across the amplifier, and (iii) a reset switch coupled in parallel across the feedback capacitor;
an event detector configured to sense a high-energy event affecting the photodetector; and
a switchable clamp coupled across inputs of the amplifier, the event detector configured to close the switchable clamp in response to sensing the high-energy event.

9. The system of claim 8, wherein, in each optical detector:
the amplifier is configured to receive the electrical current on an inverting input terminal and the reference voltage on a non-inverting input terminal, the inverting input terminal coupled to an output of the photodetector; and
the switchable clamp is configured to couple the inverting input terminal to the non-inverting input terminal in order to cause the inverting input terminal to receive the reference voltage.

10. The system of claim 8, wherein each optical detector further comprises:
a second capacitor configured to couple the event detector to an output of the photodetector.

11. The system of claim 8, wherein, in each optical detector:
the switchable clamp comprises first and second transistors coupled in series;
the first transistor is configured to selectively form and break an electrical connection; and
the second transistor is a dummy transistor.

12. The system of claim 8, wherein each optical detector further comprises:
a pulse counter coupled to an output of the event detector and configured to count a number of high-energy events sensed by the event detector.

13. The system of claim 8, wherein, in each optical detector, the event detector is configured to close the switchable clamp in order to prevent at least some of the electrical current generated by the photodetector during the high-energy event from being integrated by the CTIA unit cell.

14. The system of claim 8, wherein each optical detector further comprises:
a switch coupled to an output of the amplifier, the switch configured to be opened during integration of the electrical current and to be closed to allow sampling of an integrated voltage.

15. The system of claim 8, further comprising:
a data processing system configured to process output signals from the focal plane array and generate one or more images of a scene.

16. A method comprising:
generating an electrical current based on received illumination using a photodetector;
integrating the electrical current using a capacitor transimpedance amplifier (CTIA) unit cell comprising (i) an amplifier that receives the electrical current and a reference voltage, (ii) a feedback capacitor coupled in parallel across the amplifier, and (iii) a reset switch coupled in parallel across the feedback capacitor;
sensing a high-energy event affecting the photodetector; and
in response to sensing the high-energy event, closing a switchable clamp coupled across inputs of the amplifier.

17. The method of claim 16, wherein:
the amplifier receives the electrical current on an inverting input terminal and the reference voltage on a non-inverting input terminal, the inverting input terminal coupled to an output of the photodetector; and the switchable clamp is configured to couple the inverting input terminal to the non-inverting input terminal in order to cause the inverting input terminal to receive the reference voltage.

18. The method of claim 16, wherein:

the switchable clamp comprises first and second transistors coupled in series;

the first transistor selectively forms and breaks an electrical connection; and the second transistor is a dummy transistor.

19. The method of claim 16, further comprising:

counting a number of high-energy events that are sensed.

20. The method of claim 16, wherein closing the switchable clamp prevents at least some of the electrical current generated by the photodetector during the high-energy event from being integrated by the CTIA unit cell.

\* \* \* \* \*